United States Patent
Li et al.

(10) Patent No.: US 12,225,678 B2
(45) Date of Patent: Feb. 11, 2025

(54) NODE INTERLOCKING SERVER

(71) Applicant: SHANDONG YINGXIN COMPUTER TECHNOLOGIES CO., LTD., Shandong (CN)

(72) Inventors: Xiaozheng Li, Shandong (CN); Jiajin Yuan, Shandong (CN)

(73) Assignee: SHANDONG YINGXIN COMPUTER TECHNOLOGIES CO., LTD., Shandong (CN)

(*) Notice: Subject to any disclaimer, the term of this patent is extended or adjusted under 35 U.S.C. 154(b) by 213 days.

(21) Appl. No.: 18/024,902

(22) PCT Filed: Feb. 28, 2022

(86) PCT No.: PCT/CN2022/078337
§ 371 (c)(1),
(2) Date: Mar. 6, 2023

(87) PCT Pub. No.: WO2022/188654
PCT Pub. Date: Sep. 15, 2022

(65) Prior Publication Data
US 2023/0320019 A1 Oct. 5, 2023

(30) Foreign Application Priority Data

Mar. 12, 2021 (CN) .......................... 202110270337.4

(51) Int. Cl.
*H05K 7/14* (2006.01)
*G06F 1/18* (2006.01)

(52) U.S. Cl.
CPC ........... *H05K 7/1489* (2013.01); *G06F 1/187* (2013.01)

(58) Field of Classification Search
CPC .............................. H05K 7/1489; G06F 1/187
(Continued)

(56) References Cited

U.S. PATENT DOCUMENTS 7,944,700 B2 * 5/2011 Wang ................. G06F 1/183
361/736
2016/0262282 A1 * 9/2016 Li ..................... H05K 7/1489

FOREIGN PATENT DOCUMENTS

CN 101588691 A 11/2009
CN 205104166 U 3/2016
(Continued)

OTHER PUBLICATIONS

PCT/CN2022/078337 international search report.

*Primary Examiner* — Jinhee J Lee
*Assistant Examiner* — Peter Krim
(74) *Attorney, Agent, or Firm* — IPro, PLLC

(57) ABSTRACT

A node-interlocked server, comprising a chassis and node modules, wherein a linking and interlocking rod is slidably mounted to the chassis; stopping and blocking slots and guiding bevel edges are respectively provided on two sides of the respective node modules; in response to that one of the node modules is being drawn outwardly, the corresponding guiding bevel edge pushes the linking and interlocking rod to move toward another one of the node modules, and the linking and interlocking rod is able to be inserted into the corresponding stopping and blocking slot to block the another one of the node modules from being drawn out; and a reset device is provided at the linking and interlocking rod, and in response to that the linking and interlocking rod is not subjected an acting force applied by the node modules, the linking and interlocking rod is restored to an initial position.

20 Claims, 2 Drawing Sheets

(58) Field of Classification Search
USPC .................................. 361/801, 803, 727, 756
See application file for complete search history.

(56) References Cited

FOREIGN PATENT DOCUMENTS

| | | |
|---|---|---|
| CN | 208403740 U | 1/2019 |
| CN | 113126707 A | 7/2021 |

\* cited by examiner

NODE INTERLOCKING SERVER

CROSS-REFERENCE TO RELATED APPLICATION

The present application claims the priority of the Chinese patent application filed on Mar. 12, 2021 before the Chinese Patent Office with the application number of 202110270337.4 and the title of "NODE INTERLOCKING SERVER", the content of which is incorporated herein in its entirety by reference.

FIELD

The present application relates to the technical field of servers, and particularly relates to a node-interlocked server.

BACKGROUND

Inside a server usually two node modules are provided, and each of the node modules may be drawn out of the interior of the server, to plug/pull and maintain the node module from a side thereof.

Drawing a node module out of a server causes deviation of gravity center of the server, to cause the server to be unstable and easily incline. Especially, when the two node modules inside the server have been drawn out simultaneously, the gravity center has been totally moved to exterior of a chassis of the server, which more easily causes toppling.

SUMMARY

The present application provides a node-interlocked server, which prevents a risk of toppling caused by simultaneous drawing the node modules out. The particular solutions are as follows:

A node-interlocked server, including a chassis and node modules, wherein a linking and interlocking rod is slidably mounted to the chassis, and the linking and interlocking rod is located between two of the node modules;

stopping and blocking slots and guiding bevel edges are respectively provided on two sides of the respectively node modules that are close to the linking and interlocking rod, a length of the linking and interlocking rod is greater than a minimum spacing between two of the guiding bevel edge and less than a maximum spacing between two of the guiding bevel edge;

in response to that one of the node modules is drawn outwardly, the corresponding guiding bevel edge pushes the linking and interlocking rod to move toward another one of the node modules, and the linking and interlocking rod is able to be inserted into the corresponding stopping and blocking slot to block the another one of the node modules from being drawn out; and a reset device is provided at the linking and interlocking rod, and in response to that the linking and interlocking rod is not subjected an acting force applied by the node modules, the linking and interlocking rod is restored to an initial position.

In an embodiment of the disclosure, the reset device includes springs nested to a periphery of the linking and interlocking rod, stopping rings are provided to protrude out of the periphery of the linking and interlocking rod, one ends of the respective springs abut against the stopping rings, and another ends of the respective springs abut against the chassis.

In an embodiment of the disclosure, the springs and the stopping rings are respectively symmetrically arranged by two.

In an embodiment of the disclosure, the linking and interlocking rod is provided under guide rails of the node modules.

In an embodiment of the disclosure, the linking and interlocking rod is provided on a front side of the chassis.

In an embodiment of the disclosure, the linking and interlocking rod is slidably mounted to a limiting support, and the limiting support is mounted to the chassis; and avoiding holes for avoiding the linking and interlocking rod are provided at the chassis.

In an embodiment of the disclosure, the limiting support is detachably fixed to the chassis by using bolts.

The present application further provides a method for manufacturing a node-interlocked server, and the method includes providing the above node-interlocked server.

The present application further provides a method for using a node-interlocked server, and the method includes using the above node-interlocked server.

BRIEF DESCRIPTION OF THE DRAWINGS

In order to more clearly illustrate the technical solutions of the embodiments of the present application or the prior art, the required drawings for describing the embodiments or the prior art will be briefly described below. Apparently, the drawings described below are merely embodiments of the present application, and according to these drawings, an ordinary skilled in the art may obtain other drawings without paying creative labor.

The drawings include.

Figure 1:
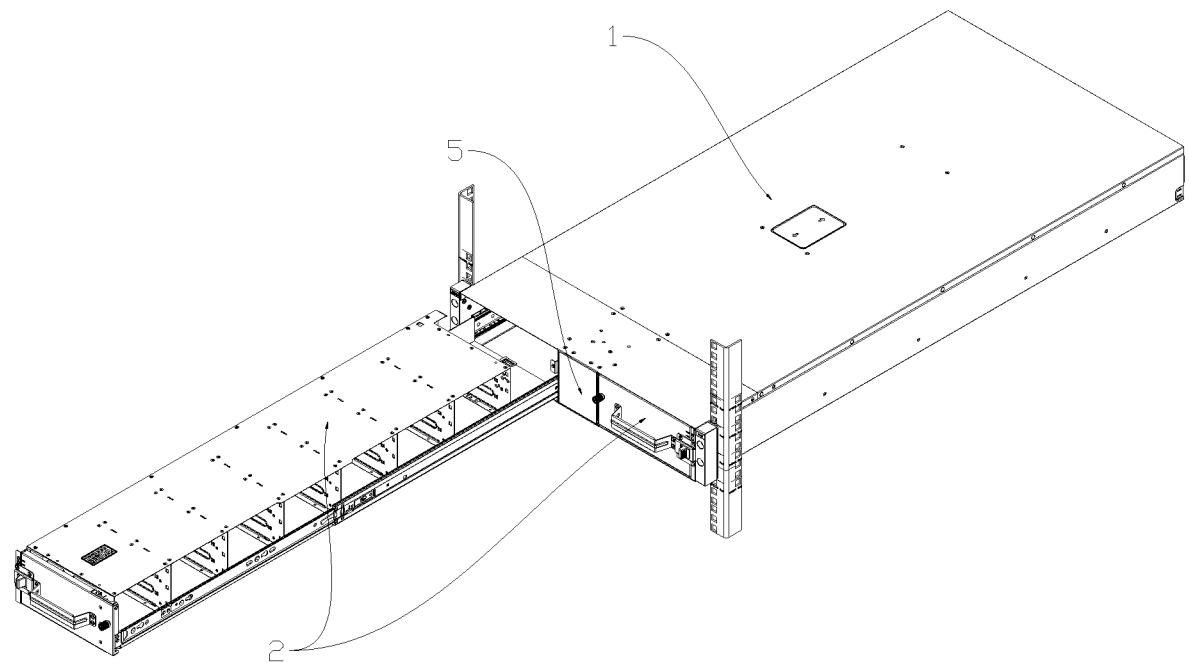
FIG. 1 is a schematic diagram showing a state in which a node module has been drawn out of a chassis.

chassis 1, avoiding hole 11, node modules 2, stopping and blocking slot 21, guiding bevel edge 22, linking and interlocking rod 3, stopping ring 31, spring 4 and limiting support 5.

DETAILED DESCRIPTION

How to prevent the node modules from being simultaneously drawn out to cause toppling is a technical problem required to be solved currently.

The purpose of the present application is to provide a node-interlocked server, which prevents the risk of toppling caused by simultaneous drawing the node modules out.

In order to enable a person skilled in the art to better understand the technical solutions of the present application, the node-interlocked server according to the present application will be described in detail below with reference to the drawings and the embodiments.

Figure 2:
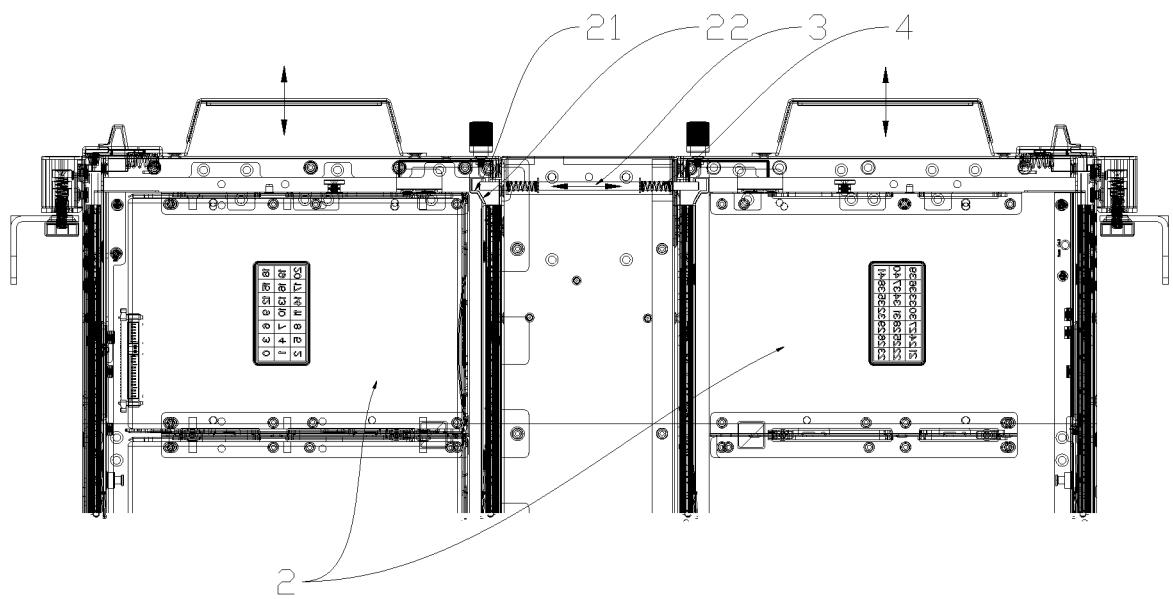
FIG. 2 is a schematic diagram of a partial structural showing that node modules have been retracted into the chassis.

The node-interlocked server according to the present application includes a chassis 1 and node modules 2. The node modules 2 are mounted inside the chassis 1, and may slide relative to the chassis 1, such that the node modules 2 may be drawn out of the chassis 1. As shown in FIG. 1, FIG. 1 is a schematic diagram showing a state in which one node module 2 has been drawn out of the chassis 1. FIG. 2 is a schematic diagram of a partial structural showing that node modules 2 have been retracted into the chassis 1. The two node modules may move in a reciprocating manner in a direction shown by vertical double-headed arrows, and in this space, the node modules may move horizontally.

A linking and interlocking rod 3 is slidably mounted to the chassis 1. The linking and interlocking rod 3 is located between the two node modules 2. A sliding direction of the linking and interlocking rod 3 is substantially perpendicular to a movement direction of the node module 2. The linking and interlocking rod 3 may move in its axis direction. As shown in FIG. 2, the linking and interlocking rod 3 may slide in a reciprocating manner in a direction shown by a horizontal double-headed arrow, and in this space, the linking and interlocking rod 3 may move substantially horizontally.

Stopping and blocking slots 21 and guiding bevel edges 22 are provided on respective sides of the two node modules 2 that are close to the linking and interlocking rod 3. Because the guiding bevel edges 22 are set obliquely, spacings between respective locations of the two guiding bevel edges 22 are not equal, and the two guiding bevel edges 22 present a horn-mouth shape. The more the respective locations of the two guiding bevel edges 22 are close to outside of the chassis, the greater the spacing between the two guiding bevel edges 22 is. In other words, in FIG. 2, the spacings therebetween of upper positions are greater, and the spacings therebetween of lower positions are smaller. A minimum spacing between the guiding bevel edges 22 is equal to a spacing between side walls of the two node modules 2. The guiding bevel edges 22 are respectively connected to the stopping and blocking slots 21, a step structure for blocking the linking and interlocking rod 3 is formed between each of the guiding bevel edges 22 and the corresponding stopping and blocking slot 21, and when the linking and interlocking rod 3 has moved out of the guiding bevel edge 22, the linking and interlocking rod 3 enters into the stopping and blocking slot 21.

A spacing between the two stopping and blocking slots 21 is greater than a maximum spacing between the two guiding bevel edges 22. A length of the linking and interlocking rod 3 is greater than a minimum spacing between the two guiding bevel edges 22 and less than the maximum spacing between the two guiding bevel edges 22. In other words, the length of the linking and interlocking rod 3 is between the maximum spacing and the minimum spacing between the two guiding bevel edges 22.

In an initial position, spacings from the linking and interlocking rod 3 to the two node modules are equal, and the length of the linking and interlocking rod 3 is greater than the spacing between the side walls of the two node modules. Therefore, when the two node modules 2 are being drawn out simultaneously, the guiding bevel edges 22 of the two node modules 2 apply acting forces on ends of the linking and interlocking rod 3 simultaneously. With combination of that shown in FIG. 2, the node module 2 on the left applies a rightward acting force on a left end of the linking and interlocking rod 3, and the node module 2 on the right applies a leftward acting force on a right end of the linking and interlocking rod 3, whereby the linking and interlocking rod 3 is not capable of moving. However, the length of the linking and interlocking rod 3 is greater than the spacing between the two side walls of the two node modules 2, therefore the two node modules 2 are not capable of being drawn out simultaneously.

When one of the node modules 2 is being drawn outwardly, the guiding bevel edge 22 pushes the linking and interlocking rod 3 to move toward another node module 2, such that the linking and interlocking rod 3 is capable of being inserted into the stopping and blocking slot 21 to block the another node module 2 from being drawn out. It should be noted that the linking and interlocking rod 3 directly faces the stopping and blocking slots 21 in an initial state, however, because the linking and interlocking rod 3 maintains in a middle position between the two stopping and blocking slots 21, the linking and interlocking rod 3, at the moment, does not block any of the two node modules 2. When the node module 2 on the left in FIG. 2 is being drawn out, the guiding bevel edge 22 on the left applies the rightward acting force on the linking and interlocking rod 3, to cause the linking and interlocking rod 3 to slide to a right side of the linking and interlocking rod 3, to protrude into the stopping and blocking slot 21 on the right side of the linking and interlocking rod 3. At this time, when the node module 2 on the right side in FIG. 2 is being pulled outwardly, a step face of the stopping and blocking slot 21 on the right side of the linking and interlocking rod 3 is blocked by the linking and interlocking rod 3, and the linking and interlocking rod 3 is not capable of moving in a direction perpendicularly to its axis direction, so that the node module 2 on the right side of the linking and interlocking rod 3 is blocked to be drawn out. For the same reason, if the node module 2 on the right side of the linking and interlocking rod 3 is drawn out it may also block the node module 2 on a left side of the linking and interlocking rod 3, which ensures that at the same moment merely one of the node modules is being drawn out, so as to prevent an excessive deviation of gravity center of the chassis.

A reset device is provided at the linking and interlocking rod 3, and when the linking and interlocking rod 3 is not subjected the acting force applied by the node modules 2, the linking and interlocking rod is restored to the initial position. Following the above-described example, after the node module 2 on the left side of the linking and interlocking rod 3 has been drawn out, and if the node module 2 on the left side is retracted into the chassis 1, the guiding bevel edge 22 on the left side does not apply the acting force on the linking and interlocking rod 3 any more, such that the linking and interlocking rod 3 is restored to the initial position by an action of the reset device, and at this time, does not block the node modules any more.

In the node-interlocked server according to the present application, by providing the stopping and blocking slots 21 and the guiding bevel edges 22 at the node modules 2, to cooperate with the linking and interlocking rod 3 which is able to move relative to the chassis 1, it is realized that at the same moment merely a single node module 2 is allowed to be drawn out, thereby preventing the problem of toppling caused by simultaneous drawing the node modules out.

Figure 3:
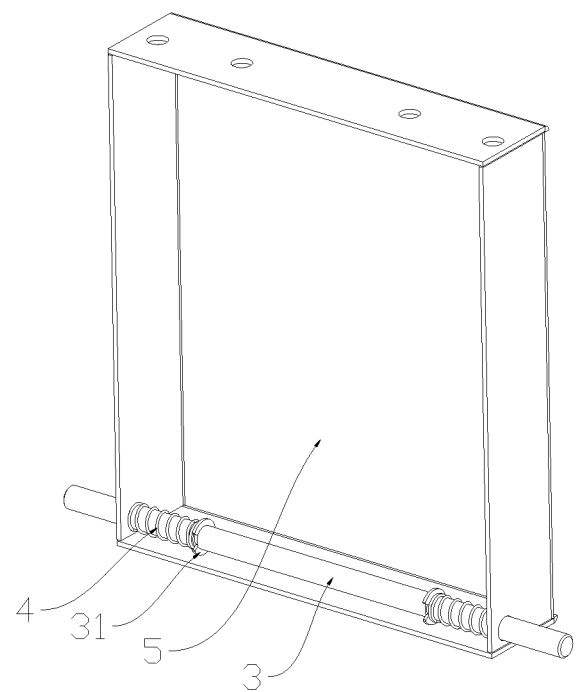
FIG. 3 is a structural diagram showing that a limiting support and a linking and interlocking rod cooperate with each other.

On the basis of the above-described solutions, the present application hereby provides a particular structural form of the reset device, as shown in FIG. 3, the reset device includes springs 4 nested to a periphery of the linking and interlocking rod 3, stopping rings 31 are provided to protrude out of the periphery of the linking and interlocking rod 3, and the stopping rings 31 are fixed to the linking and interlocking rod 3. One ends of the respective springs 4 abut against the stopping rings 31, and another ends of the respective springs 4 abut against the chassis 1. When the linking and interlocking rod 3 moves in a axial direction, it squeezes one of the springs 4, to cause the spring 4 to deform to generate an elastic force.

Particularly, as shown in FIGS. 2 and 3, the springs 4 and the stopping rings 31 according to the present application are respectively symmetrically arranged by two. That is, the stopping rings 31 are correspondingly provided by two.

Because, when the node modules 2 have been drawn out it is required to plug or pull corresponding components on sides of the node modules 2, the linking and interlocking rod 3 is provided under guide rails of the node modules 2, to reduce interference on the normal operations.

On the basis of any one of the above-described technical solutions, the linking and interlocking rod 3 according to the present application is provided at a front side of the chassis 1, that is, a direction in which the node modules 2 are able to be drawn out.

As shown in FIG. 3, FIG. 3 is a structural diagram showing that a limiting support 5 and the linking and interlocking rod 3 cooperate with each other. The linking and interlocking rod 3 is slidably mounted to the limiting support 5, and the limiting support 5 is mounted to the chassis 1. In other words, the linking and interlocking rod 3 is directly mounted to the limiting support 5, and the limiting support 5, as a part of the chassis 1, enables the linking and interlocking rod 3 to be indirectly mounted to the chassis 1.

Figure 4:
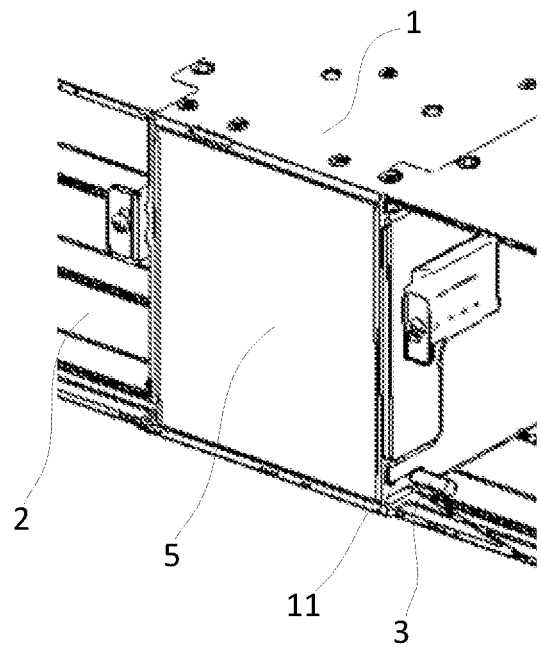
FIG. 4 is a schematic diagram of a partial structural showing a front side of the chassis.

As shown in FIG. 4, FIG. 4 is a schematic diagram of a partial structural showing the front side of the chassis 1. Avoiding holes 11 for avoiding the linking and interlocking rod 3 are provided at the chassis 1. Front sides of the avoiding holes 11 are in communication with outside, which are able to cause the linking and interlocking rod 3 to be placed therein horizontally, so as to contact the node modules.

Further, the limiting support 5 according to the present application is detachably fixed to the chassis 1 by using bolts. The limiting support 5 may be separately detached from the chassis 1. In assembling, the two node modules 2 are firstly placed into the chassis 1, and then the limiting support 5 is mounted to the chassis 1. Alternatively, when overall maintenance is required, the limiting support 5 may be firstly detached, and the two node modules may be simultaneously taken out.

The present application further provides a method for manufacturing a node-interlocked server, and the method includes providing the above node-interlocked server.

The present application further provides a method for using a node-interlocked server, and the method includes using the above node-interlocked server.

The present application provides a node-interlocked server, wherein a linking and interlocking rod is slidably mounted to a chassis, and the linking and interlocking rod is located between two node modules. Stopping and blocking slots and guiding bevel edges are respectively provided on two side of the respective two node modules that are close to the linking and interlocking rod. Spacings between respective locations of the two guiding bevel edges are not completely equal, and the length of the linking and interlocking rod is greater than a minimum spacing between the two guiding bevel edges and less than a maximum spacing between the two guiding bevel edges. Therefore, when one of the node modules is being drawn outwardly, the guiding bevel edge of that node module applies a pushing force on the linking and interlocking rod, to push the linking and interlocking rod to move toward another node module, to insert the linking and interlocking rod into the stopping and blocking slot, thereby blocking the node module from being drawn out. Merely when the node module has been pushed back into the chassis, the guiding bevel edge does not push the linking and interlocking rod, and the linking and interlocking rod is restored to an initial position by an action of a reset device. Accordingly, any one of the two node modules may be drawn out, and when it is being drawn out the other node module is blocked, which prevents the risk of toppling caused by simultaneous drawing the node modules out.

The above description on the disclosed embodiments enables a person skilled in the art to implement or use the present application. Various modifications on those embodiments will be apparent to a person skilled in the art, and the general principle defined herein may be implemented in other embodiments without departing from the spirit or scope of the present application. Therefore, the present application should not be limited to the embodiments illustrated herein, but should meet the broadest scope in accordance with the principle and the novel features disclosed herein.

The invention claimed is:

1. A node-interlocked server, comprising a chassis and node modules, wherein a linking and interlocking rod is slidably mounted to the chassis, and the linking and interlocking rod is located between two of the node modules;

stopping and blocking slots and guiding bevel edges are respectively provided on two sides of the respective node modules that are close to the linking and interlocking rod, a length of the linking and interlocking rod is greater than a minimum spacing between two of the guiding bevel edges and less than a maximum spacing between two of the guiding bevel edges;

in response to one of the node modules is being drawn outwardly, the corresponding guiding bevel edge pushes the linking and interlocking rod to move toward another one of the node modules, and the linking and interlocking rod is able to be inserted into the corresponding stopping and blocking slot to block the another one of the node modules from being drawn out; and a reset device is provided at the linking and interlocking rod, and in response to the linking and interlocking rod not being subjected by an acting force applied by the node modules, the linking and interlocking rod is restored to an initial position.

2. The node-interlocked server according to claim 1, wherein the reset device comprises springs nested to a periphery of the linking and interlocking rod, stopping rings are provided to protrude out of the periphery of the linking and interlocking rod, one end of the respective springs abut against the stopping rings, and the other end of the respective springs abut against the chassis.

3. The node-interlocked server according to claim 2, wherein the springs and the stopping rings are respectively symmetrically arranged by two.

4. The node-interlocked server according to claim 1, wherein the linking and interlocking rod is provided under guide rails of the node modules.

5. The node-interlocked server according to claim 1, wherein the linking and interlocking rod is provided on a front side of the chassis.

6. The node-interlocked server according to claim 5, wherein the linking and interlocking rod is slidably mounted to a limiting support, and the limiting support is mounted to the chassis; and avoiding holes for avoiding the linking and interlocking rod are provided at the chassis.

7. The node-interlocked server according to claim 6, wherein the limiting support is detachably fixed to the chassis by using bolts.

8. The node-interlocked server according to claim 1, wherein the node modules are provided by two.

9. The node-interlocked server according to claim 1, wherein a sliding direction of the linking and interlocking rod is perpendicular to a movement direction of the node modules.

10. The node-interlocked server according to claim 1, wherein the two guiding bevel edges present a horn-mouth shape.

11. The node-interlocked server according to claim 1, wherein a step structure for blocking the linking and interlocking rod is formed between each of the guiding bevel edges and the corresponding stopping and blocking slot, and in response to the linking and interlocking rod moving out of the guiding bevel edge, the linking and interlocking rod enters into the stopping and blocking slot.

12. The node-interlocked server according to claim 1, wherein a spacing between two of the stopping and blocking slots is greater than the maximum spacing between the two guiding bevel edges.

13. The node-interlocked server according to claim 1, wherein in the initial position, spacings from the linking and interlocking rod the two node modules are equal.

14. The node-interlocked server according to claim 1, wherein the length of the linking and interlocking rod is greater than a spacing between the side walls of the two node modules.

15. The node-interlocked server according to claim 6, wherein front sides of the avoiding holes are in communication with outside, which are able to cause the linking and interlocking rod to be placed therein horizontally, so as to contact the node modules.

16. The node-interlocked server according to claim 7, wherein, in response to assembling, the two node modules are firstly placed into the chassis, and then the limiting support is mounted to the chassis.

17. The node-interlocked server according to claim 7, wherein, in response to assembling and when an overall maintenance is required, the limiting support is able to be detached first, and the two node modules are able to be simultaneously taken out.

18. The node-interlocked server according to claim 1, wherein in response to that the two node modules are being drawn out simultaneously, the guiding bevel edges of the two node modules apply acting forces on ends of the linking and interlocking rod simultaneously, the linking and interlocking rod is not able to move, such that the two node modules are not able to be drawn out simultaneously.

19. A method for manufacturing a node-interlocked server, comprising:
providing the node-interlocked server according to claim 1.

20. A method for using a node-interlocked server, comprising:
using the node-interlocked server according to claim 1.

* * * * *